US009332637B2

(12) United States Patent
Das et al.

(10) Patent No.: US 9,332,637 B2
(45) Date of Patent: May 3, 2016

(54) ULTRA LOW LOSS DIELECTRIC THERMOSETTING RESIN COMPOSITIONS AND HIGH PERFORMANCE LAMINATES MANUFACTURED THEREFROM

(71) Applicant: NOVOSET, LLC, Peapack, NJ (US)

(72) Inventors: Sajal Das, Bedminster, NJ (US); Patrick Shipman, Stirling, NJ (US)

(73) Assignee: Novoset LLC, Peapack, NJ (US)

( * ) Notice: Subject to any disclaimer, the term of this patent is extended or adjusted under 35 U.S.C. 154(b) by 42 days.

(21) Appl. No.: 13/998,482

(22) Filed: Nov. 4, 2013

(65) Prior Publication Data

US 2015/0126684 A1    May 7, 2015

(51) Int. Cl.
*H05K 1/03*    (2006.01)

(52) U.S. Cl.
CPC ........ *H05K 1/0346* (2013.01); *H05K 2201/015* (2013.01); *H05K 2201/0158* (2013.01); *H05K 2201/0162* (2013.01)

(58) Field of Classification Search
CPC .................................................. H05K 1/0346
USPC ........................................................ 525/543
See application file for complete search history.

(56) References Cited

U.S. PATENT DOCUMENTS

| 3,330,829 | A | * | 7/1967 | Creasey et al. | 544/212 |
| 4,110,364 | A | * | 8/1978 | Gaku et al. | 528/170 |
| 4,153,640 | A | | 5/1979 | Deiner et al. | 526/194 |
| 4,396,679 | A | * | 8/1983 | Gaku et al. | 428/412 |
| 4,780,507 | A | * | 10/1988 | Gaku et al. | 525/113 |
| 4,797,454 | A | | 1/1989 | Ryang | 525/476 |
| 5,422,184 | A | * | 6/1995 | Papathomas | 428/411.1 |
| 5,571,609 | A | | 11/1996 | St. Lawrence et al. | 442/234 |
| 6,245,841 | B1 | | 6/2001 | Yeager et al. | 524/101 |
| 7,425,371 | B2 | | 9/2008 | Sharma et al. | 428/441 |
| 8,404,764 | B1 | | 3/2013 | Yu et al. | 524/97 |
| 2004/0254329 | A1 | | 12/2004 | Daum et al. | 528/119 |
| 2005/0173780 | A1 | | 8/2005 | Sethumadhavan et al. | 237/632 |
| 2007/0203308 | A1 | | 8/2007 | Mori et al. | 525/524 |
| 2013/0172459 | A1 | | 7/2013 | Tsuchikawa et al. | 524/188 |
| 2013/0245161 | A1 | | 9/2013 | Hsieh et al. | 523/466 |

FOREIGN PATENT DOCUMENTS

| CN | 101824157 | | 9/2010 | ................. C08J 3/24 |
| JP | 54142300 | A  * | 11/1979 | ............ C08G 83/00 |
| JP | 55098244 | A  * | 7/1980 | ............. C08L 47/00 |

OTHER PUBLICATIONS

Machine Translation of CN 101824157 A.*
Liu et al ("Cyanate ester resin modified by hydroxyl terminated polybutadiene: Morphology, thermal, and mechanical properties." Polymer Engineering and Science, vol. 51, Issue 7, pp. 1404-1408, Jul. 2011. DOI: 10.1002/pen.21952).*

* cited by examiner

*Primary Examiner* — Mike M Dollinger
(74) *Attorney, Agent, or Firm* — Ernest D. Buff & Associates, LLC; Ernest D. Buff; Margaret A. LaCroix

(57) ABSTRACT

A ultra low loss dielectric thermosetting resin composition has at least one cyanate ester component (A) and at least one reactive intermediate component (B) that is capable of copolymerization with said component (A). The invention is a cyanate ester resin of the form: $T_n\text{-}[W\text{-}(Z)_f/(H)_{1-f}\text{-}W]_{n-1}\text{-}[W\text{-}(Z)_f/(H)_{1-f}\text{-}(OCN)_f/(R)_{1-f}]_{n+2}$, wherein T is a 1,3,5-substituted-triazine moiety ($C_3N_3$); W is a linking atom between triazine and either component A or component B; Z is component (A); H is component (B); OCN is a cyanate ester end group; R is a reactive end group of component B; n is an integer greater than or equal to 1; and f is a weight or mole fraction of component A. The composition exhibits excellent dielectric properties and yields a high performance laminate for use in high layer count, multilayer printed circuit board (PCB), prepregs, resin coated copper (RCC), film adhesives, high frequency radomes, radio frequency (RF) laminates and various composites.

25 Claims, No Drawings

ULTRA LOW LOSS DIELECTRIC THERMOSETTING RESIN COMPOSITIONS AND HIGH PERFORMANCE LAMINATES MANUFACTURED THEREFROM

BACKGROUND OF THE INVENTION

1. Field of the Invention

This invention relates to thermosetting resin compositions that are useful as high performance and high layer count, multilayer printed circuit board (PCB), prepregs, resin coated copper (RCC), film adhesives, high frequency radomes, radio frequency (RF) laminates and various other composites made from resin compositions.

2. Description of the Prior Art

Advances in electronic devices continue to approach the limit of printed circuit board (PCB) technologies. The performance requirements for composite and laminate materials are becoming more stringent. In the "cloud computing", Smartphone industries and wireless communication (4 G and 4G LET Advanced) for example, high speed high frequency circuits require substrates with difficult to attain electrical properties, such as ultra low dielectric loss and low dielectric constant. Current composite materials fail to meet some of the most critical requirements such as dielectric loss in high-speed communications. As frequency increases, the amount of signal loss to the substrate becomes more significant. As a result, materials are required that will give PCBs the required electrical properties for rapid transmission of high frequency signals with signals integrity, while maintaining the thermal, physical and mechanical properties desirable for PCBs.

Various composite materials employed include Polytetrafluoroethyene (PTFE). Although PTFE is an excellent low dielectric material, it suffers from significant processing problems such as a lack of fluidity due to high melt temperature and viscosity; the inability to form multilayer boards (high layer count) and low glass transition temperature (Tg). These processing problems limit PTFE use in radio frequency (RF) applications and limited multilayer digital substrate applications. PTFE is also a high price material, which further prohibits its use in the mass production of consumer electronics.

Epoxy resins on other hand are the industry standard for PCB manufacture due to low cost and good processing conditions. However poor electric properties and low glass transition (Tg) limit epoxy to use as high speed communication and high temperature integrated circuit (IC) substrates suitable for tablets and other computing industries. The most common mass production epoxy laminates are FR-4, FR-5 and various enhanced epoxies.

Another composite material employed includes Cyanate esters (CE) which are known for generating thermoset materials with mid range dielectric constants and dielectric loss properties. CEs are considered useful for high performance substrate applications. Benefits of these materials include process-ability similar to epoxy laminates (FR-4) and good thermal properties in dry conditions.

However, cyanate resins have been disadvantageous in several aspects. Typical prior art cyanate resins include:

Blending CEs with thermoplastics and elastomers to form resins. Disadvantageously, this blend has been found to generate semi-interpenetrating networks rather than uniform resins and often causes phase separation between cyanate and modifier domains. It has been found that the use of hydroxylated polybutadiene (HPBD) in modifying CEs by mixing/blending the two materials and directly curing them generates a material with significant phase separation, which results in poor thermal resistance. It has further been determined that liquid HPBD are incompatible with many CEs and that the use of a copolymer to combine and blend the materials is required.

Various elastomer modified cyanate esters exhibit low Tg and high tackiness and are unsuitable for multilayer boards. For example:

U.S. Pat. No. 4,780,507 to Gaku et al. discloses a thermosetting resin composition comprising a thermosetting cyanate ester resin composition (A) and a butadiene based copolymer (B)(i) or an epoxy resin-modified butadiene based copolymer (B)(ii), in which component (B)(i) or (B)(ii) are used for modifying component (A). Components are first pre-polymerized into a resin and then form a non-tacky resinous material by controlling the time and temperature of the reaction between the different components. The use of solid polybutadiene-co-vinylaromatic polymers to modify CEs is disclosed. However, these materials possess glass transition temperatures below 215° C.

U.S. Pat. App. Pub. 2013/0245161 A1 discloses resins incorporating epoxies, cyanate esters and polybutadiene-styrene-divinylbenzene terpolymers, however these suffer from extremely low Tgs between 100 and 135° C. and high dissipation factors>0.005.

CN101824157 to Baixing et al. discloses a method for modifying cyanate ester resin by hydroxyl-terminated polybutadiene, which comprises the following steps: adding hydroxyl-terminated polybutadiene rubber into the cyanate ester resin with the addition quantity of 5 to 30 weight percent; heating and melting the mixture to be uniformly mixed; heating the mixture to 120+/−15DEG C. for pre-polymerization for 10 to 60 min; carrying out casting and curing; uniformly heating at 130 to 200DEG C. for 7 to 10 h for curing; and obtaining the modified cyanate ester resin. However, these CEs have been found to have low TG and high tackiness and thus lack usefulness in multilayer PCB technologies.

A significant drawback of CE resins is that they suffer from moisture uptake. Moisture plays a significant role in the failure of high frequency applications. Water contributes high Dk (80) and has high polarity; as a result even a small amount of water can have a detrimental effect on the physical and electrical properties of substrate materials. If water reacts with the resin system it may contribute to delamination during thermal performance. The resins of the invention have reduced moisture uptake due to the reaction with modifying resins. Furthermore, the commercial CEs are brittle due to a tight network structure and as a result thin substrates made from CE are fragile for drop tests in smart phone and other portable devices.

For examples, see:

U.S. Pat. No. 8,404,764 to Yu et al. discloses a resin composition comprising (A) 100 parts by weight of cyanate ester resin; (B) 5 to 25 parts by weight of nitrogen and oxygen containing heterocyclic compound; (C) 5 to 75 parts by weight of polyphenylene oxide resin; and (D) 5 to 100 parts by weight of oligomer of phenylmethane maleimide. By using specific components at specific proportions, the resin composition is taught to offer the features of low dielectric constant and low dissipation factor and can be made into prepreg that may be used in printed circuit board. Reports therein have been provided showing a polyphenylene oxide/cyanate ester resin that exhibits dissipation factors near 0.0055, and which display Tgs below 185° C.

U.S. Pat. App. No. 20070203308A1 to Mori et al. and U.S. Pat. No. 6,245,841 to Yeager et al. discloses curable compositions used in circuit boards, structural composite, encapsulating resins, and the like, comprise at least one compound selected from the group consisting of cyanate esters and cyanate ester prepolymers, a flame retardant which is substantially toluene soluble and substantially free of hydroxy residues in the cured state, and a curing catalyst. Though issues of moisture properties were addressed, the processing of this product is difficult using conventional procedures due to high melt viscosity. Furthermore, the thermoplastic (polyphenylene oxide, allyl, or liquid crystal polymers (LCD)) is only soluble in exotic solvents (toluene, xylene, etc.).

U.S. Pat. No. 5,571,609 to Lawrence St. et al. discloses an electrical substrate material comprising a thermosetting matrix which includes a polybutadiene or polyisoprene resin and an unsaturated butadiene or isoprene containing polymer in an amount of 25 to 50 vol. %; a woven glass fabric in an amount of 10 to 40 vol. %; a particulate, preferably ceramic filler in an amount of from 5 to 60 vol. %; a flame retardant and a peroxide cure initiator. A preferred composition has 18% woven glass, 41% particulate filler and 30% thermosetting matrix. The foregoing component ratios and particularly the relatively high range of particulate filler is an important feature of this invention in that this filled composite material leads to a prepreg which has very little tackiness and can therefore be easily handled by operators. Disadvantageously, this product is not suitable for high layer count boards due to the lack of adhesion of the hydrocarbon.

U.S. Pat. No. 7,425,371 discloses a thermosetting resin system that appointed to be useful in the manufacture of high performance prepreg, laminate and composite materials as well as the prepregs, laminates and composites made from the thermosetting resin composition. The reference discloses modifications of CEs with SMA but this composition lacks the electrical performance for 4G and beyond applications, and no example is given to illustrate any benefit derived by modifying CE with SMA. The large part of electrical properties was achieved by blending fused silica with epoxy, ester, elastomers such as SMA, and a flame retardant. Furthermore, the compositions claimed a chemically blended product, not a reaction intermediate.

Accordingly, there remains a need in the art for ultra low loss dielectric thermosetting resin compositions for high performance laminates. Particularly needed in the art are ultra low loss dielectric thermosetting resin compositions for use in high performance and high layer count, multilayer printed circuit board (PCB), prepregs, resin coated copper (RCC), film adhesives, high frequency radomes, radio frequency (RF) laminates and various other composites made from resin compositions. Further needed in the art is a thermosetting resin composition that exhibits excellent dielectric properties suitable but not limited for 4G and 3rd Generation Partnership Project (3GPP).

SUMMARY OF THE INVENTION

The present invention provides ultra low loss dielectric thermosetting resin compositions for high performance laminates. Ultra low loss dielectric thermosetting resin compositions are provided for use in high performance and high layer count, multilayer printed circuit board (PCB), prepregs, resin coated copper (RCC), film adhesives, high frequency radomes, radio frequency (RF) laminates and various other composites made from resin compositions. Further provided is a thermosetting resin composition that exhibits excellent dielectric properties suitable but not limited for 4G and 3rd Generation Partnership Project (3GPP).

More specifically, the invention provides a thermosetting resin having the form:

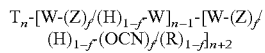

wherein "T" is a 1,3,5-substituted-triazine moiety ($C_3N_3$); "W" is a linking atom between triazine and either component A or component B; "Z" is component (A); "H" is component (B); "OCN" is cyanate ester end group; "R" is a reactive end group of component B; "n" is an integer greater than or equal to 1; and "f" is a weight or mole fraction of component A.

The invention provides a thermosetting resin composition via chemical attachment of:
  a. at least one cyanate ester component (A);
  b. at least one reactive intermediate component (B), said component B being capable of copolymerization with said component (A);

Component (A) is a member selected from the group consisting of 2,2-bis(4-Cyanatophenyl)ispropylyidene, Bisphenol F Cyanate ester, Primaset PT resin, Primaset LECY and mixtures thereof. Preferably, component (A) is represented by the formula:

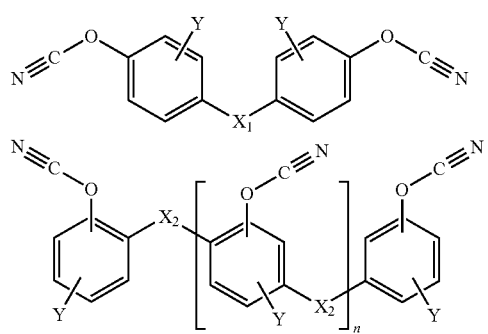

wherein $X_1$ and $X_2$ individually represent R and R is a member selected from the group consisting of —CH(CH$_3$)—, —CH$_2$—, —C(CH$_3$)$_2$—, dicyclopentadiene (DCP), and functionalized DCP; n is an integer greater than 1; and Y represents at least one functional group.

Component B is a reactive modifier selected from the group consisting of thermoplastics, small organic molecules, rubbers, and inorganic/organometallic polymers.

DETAILED DESCRIPTION OF THE INVENTION

The subject invention provides a thermosetting resin composition that exhibits excellent dielectric properties suitable but not limited for 4G and 3rd Generation Partnership Project (3GPP), which is a major enhancement of the Long Term Evolution (LTE) standard. 4G-LTE-Advanced offers a new wave of mobile functionality that will propel mobile speed and quality well into the future. 4G-LTE-Advanced offers peak data rates of 1 Gbps compared to 300 Mbps on 4G-LTE and 10×-30× faster download speeds than its predecessor. This speed can only be possible through the combination of new software and hardware and new ultra-low DK/Df materials, which play a significant role in maintaining signal integrity. The power amplifier boards for 4G LET base station and back-panel in server, network gear, and Wi-Fi, require substrates with low Dk/Df for new communication technologies. Besides electrical properties, compositions providing excellent thermal, mechanical and other physical properties are necessary for these new technologies. The subject invention provides these novel compositions in order to address the electrical properties of these new technologies.

In the present invention a thermosetting resin composition is provided that comprises at least one Cyanate ester (component A), one or more reactive intermediate (component B)

which can undergo copolymerization with CE (component A). Furthermore, the final composition of the invention is soluble in common organic solvents. Lower dielectric and good mechanical properties, as well as, optional flame retardancy properties were considered in the selection of the reactive intermediate (component B) to react with CE to form the thermosetting composition. When thermoplastic or elastomer modifiers are first reacted with the cyanate ester to generate a new polymeric material, a homogeneous system can be obtained.

The composition of the subject invention includes: a cyanate ester resin of the form:

$$T_n\text{-}[W\text{-}(Z)_f/(H)_{1-f}\text{-}W]_{n-1}\text{-}[W\text{-}(Z)_f/(H)_{1-f}(OCN)_f/(R)_{1-f}]_{n+2}$$

Where:
T=1,3,5-substituted-triazine moiety ($C_3N_3$);
W=linking atom between triazine and either component A or component B;
Z=Represents component A of the invention and comprises a cyanate ester as described below;
H=Represents component B of the invention and comprises a reactive thermoplastic or other additive as described below;
OCN=cyanate ester end group;
R=Represents the reactive end groups of component B and may include but not limited to groups such as: OH, SH, $NH_2$, Allyl, Vinyl, Phenol, Anhydrides, and Carboxylic acids;
n is an integer greater than or equal to 1;
f is the weight or mole fraction of component A in the invented resin;
Where Z represents at least one Cyanate ester (component A) of the invention.

Various CEs can be used including, but not limited to 2,2-bis(4-Cyanatophenyl) ispropylyidene (available from Lonza under trade name Primaset BADCY), Bis-(4-Cyanato-3,5-dimethylpheny)methane, Cyanated phenol-dicyclopentadine, Bis-(4-Cyanatophenyl)thioether, Bis(4-Cyanatophenyl) ether, 1,3 Bis(4-Cyanatophenyl-1(1-methyehylidene) benzene, Resorcinol dicyanate, fused ring Cyanate monomers such as naphthalene and anthraquinone, Fluoro-aliphatic dicyanates, Bisphenol F Cyanate ester, Primaset PT resin, Primaset LECY and mixtures thereof.

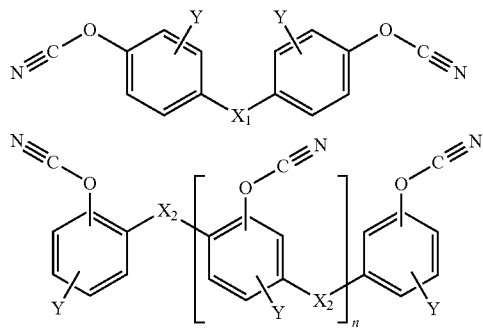

Where: $X_1$ and $X_2$ individually represent at least R, Ar, $SO_2$, O, or S. R is selected from —CH. ($CH_3$)—, —$CH_2$—, —C($CH_3$)$_2$—, dicyclopentadiene (DCP), and functionalized DCP; Ar is selected from functionalized or non-functionalized benzene, biphenyl, naphthalene, phenol novolac, bisphenol A, bisphenol A novolac, bisphenol F, and bisphenol F novolac; n is an integer greater than 1; and Y represents functional groups including but not-limited-to hydrogen, aliphatic groups, aromatic groups, or halogens. Cyanate esters can be produce by anyone skilled in the art by reaction of any phenol with cyanogen chloride in presence of TEA at low temperature. Through extensive experimentation by way of the subject invention, it has been surprisingly and unexpectedly discovered that a large fraction, 50% or greater, of Z is required in reaction with component B to achieve thermal performance of resin compositions. To achieve optimal dielectric properties 20% or greater B is required.

H representing component B of the invention is selected from reactive modifiers. These additives include but are not limited to thermoplastics, small organic molecules, rubbers, and inorganic/organometallic polymers. The reactive groups on the additives include but are not limited to hydroxyl groups, phenol groups, thiol groups, epoxy groups, malemide groups, amines, thiols, thiophenols, and phosphorous groups. The additives my also contain secondary reactive groups including but limited to allyls, vinyls, acrylates, halogens, ethyoxys, methoxys and acetylenes. The thermoplastic additives include but are not limited to hydroxylated polybutadiene (HPBD) with molecular weights between 100 and 10,000 g/mol such as Krasol LBH 2000, Krasol LBH 3000, Krasol LBH-P 2000, Krasol LBH-P 3000, Poly bd R-45HTLO, Poly bd R-20LM from Cray Valley; G-1000, G-2000, G-3000 from Nippon-Soda; Hydrogenated hydroxylated polybutadiene (HHPBD) such as Krasol HLBH-P2000, Krasol HLBH-P3000 from Cray Valley, GI-1000, GI-2100, GI-3000 and epoxidized polybutadienes and epoxidized hydroxylated polybutadiene; reactive polydimethylsiloxane (PDMS) with molecular weights between and including 100-20,000 g/mol and at least 2 functional groups per molecule of either hydroxyl or epoxy groups such as Silmer OH C50; OH J10; OH Di-10; OH Di-50; EP C50; EP J10; Di-50; EP Di-100 by Siltech; or polymethylphenylsiloxane containing between 3-9% OH functional groups such as silres 604 by Wacker. Reactive fluoro-modifiers include but are not limited to fluorinated thermoplastics such as reactive polyvinylidene fluoride (PVDF), modified fluoroethylene vinyl ether (FEVE) such as Lumiflon, and fluorinated hydrocabons such as but not limited to HO—($CF_2CF_2$)$_n$—OH where n=integer 1. Other reactive modifiers include Cardinol, phenol terminated polyphenylphosphonate (Fyrol-PMP, Nofia), DOPO, Dantocol, DHE (from Lonza), silazanes, and reactive polyphosphazenes such as phenol-modified polyphenylenephosphazene, OCN—R—NCO and its prepolymers, PPO derivatives such as SA-900 and SA-9000 from Sabic, Primaset™ PPI-600 from Lonza.

Heretofore disclosed and utilized compositions and methods have shown that liquid hydroxylated polybutadienes cannot modify cyanate esters due to the incompatibilities between the two substances. As described previously, this results in significant phase separation in resins and reduced thermal and electrical properties in the cured materials. However, it has been surprisingly and unexpectedly found by way of the subject invention through extensive experimentation that with the proper ratio and structure of the HPBD a homogenous resin and cured material with high Tg and low dielectric properties could be prepared. In this invention when liquid HPBD is used as component B it comprises linear and branched liquid HBPD (preferably linear HPBD) with hydroxyl functionalities between 2-3, preferably 2 and molecular weights between 500 Da and 100,000 Da, preferably between 1000 Da and 5000 Da with polydispersities between 1 and 3, preferably between 1 and 2.5. Further the liquid HPBD must possess 1° alcohol or 2° alcohol end groups preferably 1° alcohols to react with component A. For optimal properties the liquid HPBD when used as component B should have between 10-90% 1,2 vinyl groups, preferably between 20-75% and a ratio of 1,4-trans to 1,4-cis groups between 3:1 to 1.8:1.

Surprising and unexpectedly, the component B used has very low Tg but it has unexpectedly been found that with a properly selected ratio of component A to component B, the reaction product or composition of the subject invention yields very high Tg. The component B used to produce the resin composition possesses low dielectric properties, low moisture susceptibility; low CTE and good mechanical properties. When the resin of the subject invention is fully cured weakness of Cyanate esters are eliminated. Some component B, such as hydrocarbon elastomers, may require flame retardant materials to pass VO of laminates. Component B ranges from about 5%-50%, preferably from about 10%-35%, and most preferably from about 20%-35%. Component B present is preferably 20% and most preferably 30%. Preferably, the content of each component in the resin comprises 50-95 wt % component A; 5-50 wt %, preferably between 15-30 wt % component B, and can contain up to 30 wt % flame-retardant.

The resin composition of the present invention may be prepared through the following procedure:

The selected component A is heated between 135° C. and 200° C., preferably between 175° C. and 190° C. for between 1 and 5 hours preferably 2-3 hrs. In the next step component B is warmed to 130° C. and added into component A. The reaction mixture is then heated to between 100° C. and 195° C., preferably between 110° C. and 135° C. and stirred to react each component together. The progress of the reaction is followed by monitoring the viscosity and refractive index of the resin at 95° C. The reaction is considered complete when the viscosity of the resin at 95° C. is between 100 cP and 200,000 cP, preferably between 2500 cP and 90,000 cP, the reaction is cooled to stop the reaction to give the neat resin. Alternatively, one or more solvents can be optionally incorporated into the new thermosetting resin invention composition in order to quench the reaction and control resin viscosity With the addition of solvent, care should be taken to make sure there is no phase separation and a homogeneous resin is obtained upon dissolution. Any solvent known by one with skill in the art to be useful in conjunction with resin composition can be used. Particularly useful solvents include methyl ethyl ketone (MEK), xylene, toluene, DMF, and mixtures thereof. MEK is the most preferred solvent for this invention. When used, solvents are present in the thermosetting resin in the amount of 10-60%, preferably 15-30% and most preferably 20-25% by weight. The viscosity of the resin solution at room temperature should be between 50-1000 cP, preferably between 200-600 cP.

The resins of the invention can be cured into a solid material by heat, with or without a catalyst. Component B of the invention not only improves the physical and electrical properties of the final resin but also acts as a catalyst of the curing of the cyanate ester. Therefore, the curing of the resin of the subject invention occurs at a significantly reduced temperature compared to conventional cyanate resin. The addition of ppm level metal complex salts such as Novocure-200 (available from Novoset, LLC, NJ) to the invention further reduces the curing temperature and time.

For example, the resins in this invention can be heated between 120° C. and 190° C. for between 30 min and 240 min, preferably between 150 and 175° C. for between 60 min and 180 min. The invention can then be heated between 200-235° C. for 30 min to 240 min, preferably between 220-235° C. for 30 min to 120 min. Additionally, the subject resin can be further post-cured at temperature between 245-260° C. for 30 min to 180 min. The resins of the subject invention, when fully cured, generate solid thermoset materials that possess glass transition temperatures ($T_g$) between 180° C. and 400° C. and Tan δ between 200° C. and 500° C. The thermosetting resin compositions of the present invention can be formulated with, for example but not limited to, epoxy, SMA, PPO, APPE fillers, cured CEs or new resin composition as dielectric fillers, catalyst, and one or more flame retardant. The most common commercial flame-retardants would be suitable for new composition. Also resin laminates made from resin composition can be made Vo without halogenated flame retardant using reactive phosphorus flame-retardants such as Fyrol-PMP, DOPO, DOPO-HQ, Nofia or below structure as well as non-reactive phosphorous flame-retardants.

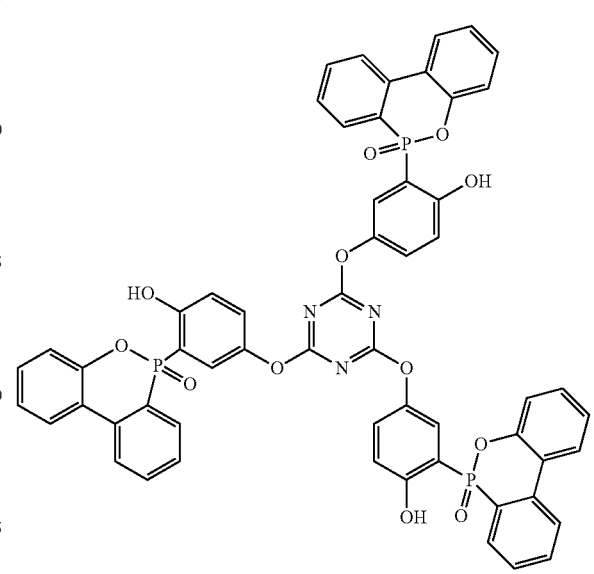

One or more catalysts are optionally added to the thermosetting resin compositions of present invention in order to enhance the rate of curing. The catalyst chosen may be suitable for CE curing such as cobalt or copper acetylacetonate, cobalt or copper octanoate, etc. or a mixture thereof. Depending on invented resin composition, other optional catalysts can include free radical catalyst such as dicumyl peroxide, the catalyst level range from ppm levels to less than 3 wt % depending on the catalysis used.

The thermosetting resin compositions of the subject invention also provide prepregs with or without tack. The compositions are particularly useful in preparation high Tg laminates with no phase separation having ultra low dielectric constants and ultra low dielectric loss. These electrical properties help solve signal speed and signal integrity problem encountered with high-speed analog and digital circuitry applications.

The thermosetting resin compositions of the subject invention are useful for making prepregs in continuous process with or without solvent. The viscosity of the inventive compositions can be adjusted for hot/melt prepreg and present substantial cost savings for prepreg production. Prepregs are generally manufactured using a core material including but not limited to a roll of woven glass, carbon, Kevlar, spectra, aramid, or quartz fibers. The thermosetting resin composition can also be coated directly to any polymeric film for the Build-up PCB. It can also be directly coated to copper using slot-die or other related coating techniques for resin-coated copper (RCC).

The prepreg materials made from the present composition can be converted to laminates. The lamination process typically follows the stack-up of one or more prepreg layers between one or more sheets of conductive foil such as copper foil. This process is often described as copper clad laminates (CCL) and is generally well known to persons with ordinary skill in the art. Pressure and temperature applied to the prepreg stack result in the formation of laminates. The laminates produce from the current invention exhibits high Tg without any phase separation. Depending on compositions of the current invention, it is also possible prepare laminates of moderate Tg (>150 C) with considerable flexibility. Flexible laminates are very useful for various bendable electronic devices.

EXAMPLES 1-20

The following examples are presented to provide a more complete understanding of the invention. The specific techniques, conditions, materials, proportions and reported data set forth to illustrate the principles and practice of the invention are exemplary and should not be construed as limiting the scope of the invention.

Example 1

100.1846 g BADCy (available from Lonza) was heated to 190° C. and stirred for 2 hours to reduce crystallinity. The reaction mixture was cooled to 175° C. and 43.2751 g 2° HPBD added in two portions. After the addition of the first 20.3303 g the temperature of the reaction mixture dropped to 158° C., the mixture was heated up to 160-170° C. and the second 22.3303 g of 2° HPBD was added (dropping the temperature to 138° C.). The mixture was heated back to 173° C. and the reaction terminated at 600 cP at 95° C.

Example 2

8.8653 g of BADCy and 3.7820 g of 2° HPBD were combined at room temperature and slowly warmed to 130° C. The reaction mixture was stirred at this temperature until a resin viscosity of 720 cP at 95° C. was reached. The resin was poured into a container and allowed to cool to room temperature. The solid resin was melted and pressed between platens at 250 psi. The resin was cured with novoCure (150 ppm active metal) for 45 min at 150° C. followed by 2 hours at 235° C. followed by a post cure for 2 hours at 260° C. Tg=241° C.

Example 3

4.9072 g_BADCy, 6.0641 g METHYLCy (available from Lonza), and 4.7156 g of 2° HPBD were combined at room temperature to form a white slurry. The slurry was heated to 184° C. to melt the cyanate esters and initiate the reaction. The reaction was terminated by cooling to room temperature when the resin viscosity reached 1200 cP at 95° C.

Example 4

7.928 g BADCy, 0.2261 g SMA and 3.2855 g, 2° HPBD were combined as a slurry at room temperature. The slurry was warmed to 150° C. and stirred until the SMA dissolved. The reaction mixture was then heated to 180° C. and the reaction continued until a viscosity of 5000 cP was reached at 95° C. Cooling to room temperature gave a tacky end product. The neat resin was cured for 2 hours at 150° C. followed by 2 hours at 235° C. followed by a post cure for 2 hours at 260° C. Tg=167° C.

Example 5

7.9728 g BADCy, 1.10191 SAM 2.0948 g 2° HPBD were combined at room temperature and heated to 174° C. to with stirring dissolve all materials and initiate the reaction. The temperature was then reduced to 137° C. and stirred for 8.5 hrs to give the final tacky semi-solid material

Example 6

8.6658 g DT4000 (available from Lonza) and 5.8277 2° HBPD combined at room temperature and heated to 160° C. to dissolve the HBPD into the molten DT4000. The reaction mixture was then heated and stirred between 180° C. and 195° C., until a resin viscosity of 700 cP was reached at 95° C.

Example 7

212.0447 g BADCy and 53.1177 g 1° HPDB were combined at room temperature and heated to 150° C. to melt the CE and combine with HPDB. The reaction mixture was stirred at this temperature for 8.5 hours. When the resin viscosity reached 7658 cP at 95° C., the resin was allowed to cool to 100° C. and MEK was added to generate a resin solution with a viscosity of 400 cP with a solid content of 75%.

Example 8

309.8981 g BADCy and 77.8439 g 1° HPBD combined at room temperature to form a slurry. The reaction mixture was then heated to 182° C. for 1.5 hour. The temperature was reduced to 153° C. for an addition 2.5 hours. When the resin viscosity reached 4545 cP at 95° C., the reaction mixture was removed from heat and allowed to cool to 100° C. and MEK was added to generate a resin solution with a solid content of 80% and a viscosity of 450 cP at 25° C.

Example 9

11.0493 g DT4000 and 78.5732 g 1° HPBD were heated with stirring to 170° C. to dissolve the HBPD into the DT4000 generating a clear solution. The reaction was stirred at temperature until the resin viscosity at 95° C. reached 2444.19, at which point the reaction was removed from heat and allowed to reach 95° C. Upon cooling the resin begins to cloud. The addition of MEK resulted in a clear dark brown solution. The resin was cured at 150° C. for 2 hours followed by 235° C. for 2 hours and post cured for 2 hours at 250° C. Tg=143° C.

Example 10

In a 1 L reaction kettle 800 g BADCy was heated to 130° C. at which point 200 g HPBD was added with stirring. This mixture was heated between and 195° C. and stirred. The reaction is terminated when the resin viscosity at 95° C. is 6000. The resin was cured at 150° C. for 2 hours followed by 235° C. for 2 hours and post cured for 2 hours at 250° C. Tg=241° C.

Example 11

In a 1 L reaction kettle 800 g METHYLCy was heated to 130° C. at which point 200 g of 1° HPBD was added with stirring. This mixture was heated to 140° C. and stirred until the resin viscosity at 95° C. reached 9281 cP. The reaction mixture was removed from heat and allowed to cool to room temperature give a clear, orange, tackles material.

Example 12

In a 1 L reaction kettle 800 g PT-30 (available from Lonza) was heated to 130° C. at which point 200 g HPBD was added with stirring. This mixture was heated between 120° C. and 195° C. and stirred. The reaction is terminated when the resin viscosity at 95° C. is 12 000 cP.

Example 13

In a 1 L reaction kettle 800 g BADCy was heated to between 175° C. and 195° C. for 2 hours at which point the reaction was cooled to 130° C. and 200 g HPBD (warmed to 130° C.) was added with stirring. This mixture was heated between 120° C. and 135° C. and stirred. The reaction is terminated when the resin viscosity at 95° C. is between 12 000 cP. The resin was cured with novocure-200 (150 ppm active metal) at 150° C. for 2 hours followed by 235° C. for 2 hours and post cured for 2 hours at 250° C. Tg=280° C.

Example 14

In a 1 L reaction kettle 800 g of BADCy was heated to 130° C. to at which point 200 g of polysiloxane was added with stirring. This mixture was heated between 120° C. and 155° C. and stirred. The reaction is terminated when the resin viscosity at 95° C. is between 5000 cP. The reaction was cooled to 90° C. and MEK was added to generated a slightly hazy yellow resin solution with a solid content of 85% and a resin viscosity of 110 cP. The resin was cured at 150° C. for 2 hours followed by 235° C. for 2 hours and post cured for 2 hours at 250° C. Tg=234° C.

Example 15

In a 1 L reaction kettle 800 g METHYLCy was heated to 130° C. at which point 200 g polysiloxane was added with stirring. This mixture was heated between 120° C. and 155° C. and stirred. The reaction is terminated when the resin viscosity at 95° C. is between 500 cP and 30 000 cP. The resin was cured at 150° C. for 2 hours followed by 235° C. for 2 hours and post cured for 2 hours at 250° C. Tg=240° C.

Example 16

In a 1 L reaction kettle 800 g DT-4000 was heated to 130° C. at which point 200 g polysiloxane was added with stirring. This mixture was heated between 120° C. and 155° C. and stirred. The reaction was terminated when the resin viscosity at 95° C. was 5425 cP. The reaction was cooled to 95° C. and MEK was added to yield a clear dark resin solution.

Example 17

In a 1 L reaction kettle 800 g BADCy was heated to 155° C. at which point 200 g fluoropolymer was added with stirring. This mixture was heated to 155° C. and stirred. The reaction is terminated when the resin viscosity at 95° C. is 2500 cP. The resin was cured at 150° C. for 2 hours followed by 235° C. for 2 hours and post cured for 2 hours at 250° C. Tg=266° C.

Example 18

In a 1 L reaction kettle 800 g METHYLCy was heated to 155° C. at which point 200 g fluoropolymer was added with stirring. This mixture was heated to 165° C. and stirred. The reaction is terminated when the resin viscosity at 95° C. is between 8000 cP. The resin was cured at 150° C. for 2 hours followed by 235° C. for 2 hours and post cured for 2 hours at 250° C. Tg=241° C.

Example 19

In a 1 L reaction kettle 700 g BADCy and 300 g cardinol were combined and heated to 110° C. with stirring The reaction is terminated when the resin viscosity at 95° C. is 7250 cP.

Example 20

In a 1 L reaction kettle 800 g BADCy and 200 g DHE were combined and heated to 110° C. with stirring The reaction is terminated when the resin viscosity at 95° C. is 2125 cP and allowed to cool to 95° C. and MEK added to give a clear solution.

Having thus described the invention in rather full detail, it will be understood that such detail need not be strictly adhered to, but that additional changes and modifications may suggest themselves to one skilled in the art, all falling within the scope of the invention as defined by the subjoined claims.

What is claimed is:

1. A thermosetting resin composition defined by the formula:

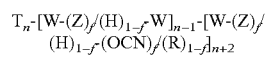

$T_n\text{-}[W\text{-}(Z)_f/(H)_{1-f}W]_{n-1}\text{-}[W\text{-}(Z)_f/(H)_{1-f}(OCN)_f/(R)_{1-f}]_{n+2}$ wherein "T" is a 1,3,5-substituted-triazine moiety ($C_3N_3$); "W" is a linking atom between triazine and either component A or component B; "Z" is component (A); "H" is component (B); "OCN" is cyanate ester end group; "R" is a reactive end group of component B; "n" is an integer greater than or equal to 1; and "f" is a weight or mole fraction of component A;

wherein said thermosetting resin composition is formed by chemical reaction between:

a. at least one cyanate ester component (A); and b. at least one reactive intermediate component (B), said component (B) being capable of copolymerization with said component (A), said component (B) being a thermoplastic selected from the group consisting of (i) hydroxylated polybutadiene (HPBD) with molecular weights between 100 and 10 000 g/mol, (ii) Hydrogenated hydroxylated polybutadiene (HHPBD), (iii) reactive polydimethylsiloxane (PDMS) with molecular weights between and including 100 20 000 g/mol and at least 2 functional groups per molecule of either hydroxyl or epoxy groups, and (iv) polymethylphenylsiloxane containing between 3-9% OH functional groups;

whereby said thermosetting resin composition does not undergo phase separation, but instead forms a neat, homogenous resin consisting of a triazine co-polymer that consists of component (A) and component (B) joined through a triazine moiety.

2. A thermosetting resin composition as recited by claim 1, wherein said component (A) is a member selected from the group consisting of 2,2-bis(4-Cyanatophenyl) isopropylidene, Bisphenol F Cyanate ester, Bisphenol E Cyanate ester, Bisphenol M Cyanate ester, dicyanate of Oxydiphenol, resorcinol Cyanate ester, Cyanated novolac, Cyanated phenol-dicyclopentadiene, diphenyl cyanate ester, naphthol aralkyl Cyanate ester and mixtures thereof.

3. A thermosetting resin composition as recited by claim 1, wherein said component (A) is defined by the formula

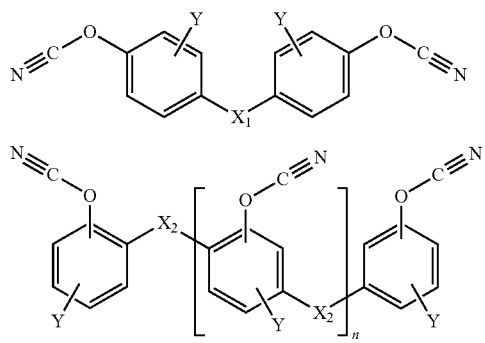

wherein $X_1$ and $X_2$ individually represent R, and R is a member selected from the group consisting of —CH(CH$_3$)—, —CH$_2$—, —C(CH$_3$)$_2$—, dicyclopentadiene (DCP), and functionalized DCP; n is an integer greater than 1; and Y represents at least one functional group.

4. A thermosetting resin composition as recited by claim 1, wherein said component (A) is defined by the formula

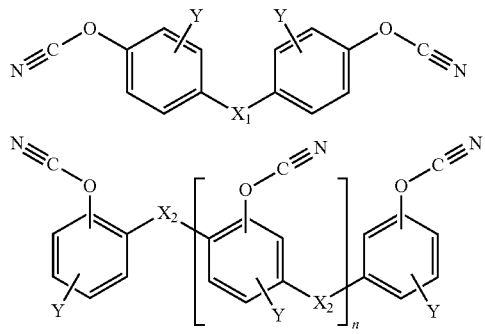

wherein $X_1$ and $X_2$ individually represent at least alkyl groups, aromatic groups, SO$_2$, O, or S; n is an integer greater than 1; and Y represents at least one functional group.

5. A thermosetting resin composition as recited by claim 4, wherein R is a member selected from the group consisting of —CH(CH$_3$)—, —CH$_2$—, —C(CH$_3$)$_2$—, dicyclopentadiene (DCP), and functionalized DCP.

6. A thermosetting resin composition as recited by claim 4, wherein Ar is a member selected from the group consisting of a functionalized or non-functionalized benzene, biphenyl, naphthalene, phenol novolac, bisphenol A, bisphenol A novolac, bisphenol F, and bisphenol F novolac.

7. A thermosetting resin composition as recited by claim 4, wherein Y is a member selected from the group consisting of hydrogen, aliphatic groups, aromatic groups, and halogens.

8. A thermosetting resin composition as recited by claim 1, wherein said component (A) is defined by the formula

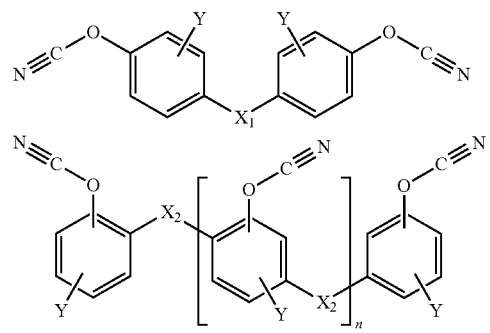

wherein $X_1$ and $X_2$ are alkyl groups, aromatic groups, SO$_2$, O, or S; n is an integer greater than 1; and Y represents at least one functional group.

9. A thermosetting resin composition as recited by claim 8, wherein R is a member selected from the group consisting of —CH(CH$_3$)—, —C(CH$_3$)$_2$—, dicyclopentadiene (DCP), and functionalized DCP.

10. A thermosetting resin composition as recited by claim 8, wherein Ar is a member selected from the group consisting of a functionalized or non-functionalized benzene, biphenyl, naphthalene, phenol novolac, bisphenol A, bisphenol A novolac, bisphenol F, and bisphenol F novolac.

11. A thermosetting resin composition as recited by claim 8, wherein Y is a member selected from the group consisting of hydrogen, aliphatic groups, aromatic groups, and halogens.

12. A thermosetting resin composition as recited by claim 8, wherein said wherein $X_2$ is R, Ar, SO$_2$, O, or S.

13. A thermosetting resin composition as recited by claim 1, wherein Z has a wt % of at least 50% in reaction with component B.

14. A thermosetting resin composition as recited by claim 1 comprising secondary reactive groups selected from the group consisting of allyls, vinyls, acrylates, halogens, ethoxys, and methoxys.

15. A thermosetting resin composition as recited by claim 1, wherein R is a member selected from the group consisting of OH, SH, NH$_2$, Allyl, Vinyl, Phenol, Anhydrides, Carboxylic acids and Acetylenes.

16. A thermosetting resin composition as recited by claim 1, wherein component B ranges from about 5%-50% by wt.

17. A thermosetting resin composition as recited by claim 1, wherein component B ranges from about 20%-35% by wt.

18. A thermosetting resin composition as recited by claim 1, wherein content of each component in said resin comprises 50-95 wt % component A, 5-50 wt % component B, and up to 30 wt % flame-retardant.

19. A thermosetting resin composition having a dielectric constant and low dielectric loss for use in multilayer printed circuit boards for high-speed analog and digital circuitry applications, and being defined by the formula:

$$T_n\text{-}[W\text{-}(Z)_f/(H)_{1-f}\text{-}W]_{n-1}\text{-}[W\text{-}(Z)_f/(H)_{1-f}\text{-}(OCN)_f/(R)_{1-f}]_{n+2}$$

wherein "T" is a 1,3,5-substituted-triazine moiety (C$_3$N$_3$); "W" is a linking atom between triazine and either component A or component B; "Z" is component (A); "H" is component (B); "OCN" is cyanate ester end group; "R" is a reactive end group of component B; "n" is an integer greater than or equal to 1; and "f" is a weight or mole fraction of component A;

wherein said thermosetting resin composition is formed by chemical reaction between:

a. at least one cyanate ester component (A); and
b. at least one reactive intermediate component (B), said component (B) being capable of copolymerization with said component (A), said component (B) being a thermoplastic selected from the group consisting of (i) hydroxylated polybutadiene (HPBD) with molecular weights between 100 and 10 000 g/mol, (ii) Hydrogenated hydroxylated polybutadiene (HHPBD), (iii) reactive polydimethylsiloxane (PDMS) with molecular weights between and including 100-20 000 g/mol and at least 2 functional groups per molecule of either hydroxyl or epoxy groups, and (iv) polymethylphenylsiloxane containing between 3-9% OH functional groups;

whereby said thermosetting resin composition does not undergo phase separation, but instead forms a neat, homogenous resin consisting of a triazine co-polymer that consists of component (A) and component (B) joined through a triazine moiety;

wherein said dielectric constant (Dk) and dielectric loss (DO is dependent on the ratio of weight percent of component (A) and component (B).

20. A thermosetting resin composition as recited by claim 19, wherein said thermosetting resin composition is used for prepregs/pre-impregnated composite fibers and adhesives.

21. A thermosetting resin composition as recited by claim 20, wherein said prepreg/pre-impregnated composite fibres are converted to laminates, wherein one or more prepreg layers are stacked-up between one or more sheets of conductive foil.

22. A thermosetting resin composition as recited by claim 19, wherein said dielectric constant (Dk) and dielectric loss (Df) is <2.2 and 0.0008 respectively at 3-10 GHz range and said component (B) has a weight percent of greater than 35%.

23. A thermosetting resin composition recited by claim 19, wherein said dielectric constant (Dk) and dielectric loss (Df) is less than 2.2 and 0.0008 respectively at 3-10 GHz and Tg>280° C.

24. A thermosetting resin composition recited by claim 1, wherein said chemical reaction between (A) and (B) is complete when said thermosetting resin composition has a viscosity between 100 cP and 200,000 cP at a reaction temperature, whereupon said thermosetting resin composition is cooled to stop said chemical reaction.

25. A thermosetting resin composition recited by claim 23, wherein said chemical reaction between (A) and (B) is complete when said thermosetting resin composition has a viscosity between 100 cP and 200,000 cP at a reaction temperature, whereupon said thermosetting resin composition is cooled to stop said chemical reaction.

* * * * *